(12) United States Patent
Kawasaki

(10) Patent No.: US 7,049,643 B2
(45) Date of Patent: May 23, 2006

(54) IMAGE PICKUP ELEMENT AND ITS MANUFACTURING METHOD

(75) Inventor: Takayuki Kawasaki, Matsubara (JP)

(73) Assignee: Sharp Kabushiki Kaisha, Osaka (JP)

( * ) Notice: Subject to any disclaimer, the term of this patent is extended or adjusted under 35 U.S.C. 154(b) by 97 days.

(21) Appl. No.: 10/856,727

(22) Filed: May 28, 2004

(65) Prior Publication Data

US 2004/0239787 A1    Dec. 2, 2004

(30) Foreign Application Priority Data

May 28, 2003    (JP)    ............... 2003-150368

(51) Int. Cl.
*H01L 27/148*    (2006.01)
(52) U.S. Cl. ...................... 257/225; 257/291
(58) Field of Classification Search ................ 257/225, 257/291
See application file for complete search history.

(56) References Cited

U.S. PATENT DOCUMENTS

2004/0239787 A1*  12/2004  Kawasaki ................. 348/294

FOREIGN PATENT DOCUMENTS

JP    01-281764    11/1989

* cited by examiner

*Primary Examiner*—Mark V. Prenty
(74) *Attorney, Agent, or Firm*—David G. Conlin; William J. Daley, Jr.; Edwards, Angell, Palmer & Dodge LLP

(57) ABSTRACT

A image pickup element has a semiconductor substrate which includes a light receiving part, an electric charge readout part, and an electric charge transfer part. The element has a non-doping region which is away from a boundary on a side of the electric charge readout part within the light receiving surface and which does not include a first impurity for identifying threshold value of the electric charge readout part, and has a layer made of the first impurity, which is provided in a doping region outside the non-doping region, within the light receiving surface, in the electric charge readout part, and in the electric charge transfer part.

4 Claims, 4 Drawing Sheets

IMAGE PICKUP ELEMENT AND ITS MANUFACTURING METHOD

This Nonprovisional application claims priority under 35 U.S.C. § 119(a) on Patent Application No. 2003-150368 filed in Japan on May 28, 2003, the entire contents of which are hereby incorporated by reference.

BACKGROUND OF THE INVENTION

The present invention relates to an image pickup element, a plurality of image pickup elements constituting a solid-state image sensing device of a CCD (i.e. Charge Coupled Device) type, and relates to a method for manufacturing the image pickup element.

There have been conventionally proposed various solid-state image sensing devices of a CCD (i.e. Charge Coupled Device) type. The CCD type solid-state image sensing device is composed of a large number of image pickup elements which are formed on a single piece of substrate, for example, in a linear or matrix form.

FIG. 4 is a figure showing a structure of a conventional image pickup element 200. The light receiving part 13 transforms an incident light into an amount of electric charge which is compliance with the intensity of the incident light. The P-type well layer 12 discharges an excess amount of electric charge generated in the light receiving part 13 when an excess amount of light is incident on the light receiving part 13, to the N-type semiconductor substrate 11. Namely, the P-type well layer 12 functions as a vertical type overflow drain. The electric charge readout part (which is also referred to as transfer gate part) 23 reads out the electric charge generated in the light receiving part 13. The CCD layer (which is also referred to as electric charge transfer part or as CCD register) 15 outputs the electric charge, of the light receiving part 13, which is read out by the electric charge readout part 23 to an output circuit (unshown). The barrier layer 14 under the CCD layer 15 prevents an exchange of electric charge between the N-type semiconductor substrate 11 and the CCD layer 15. The surface $P^+$ layer 16 includes a $P^+$ impurity layer 16a for separating between the adjacent image pickup elements, and the surface $P^+$ layer 16 controls the dark current of the light receiving part 13. Depending upon the amount of the P-type impurity doped in the impurity layer 17, the threshold value of the electric charge readout part 23 is controlled.

A description is made below upon how to manufacture the image pickup element 200, in brief.

Firstly, after the P-type well layer 12 is formed on the N-type semiconductor substrate 11, the CCD layer 15 made of the N-type impurity, the barrier layer 14 made of P-type impurity under the CCD layer 15, and the $P^+$ impurity layer 16a for separating between the adjacent image pickup elements, are formed inside the P-type well layer 12. And then the P-type impurity layer 17 for controlling the threshold value of the electric charge readout part 23 is formed by a boron radiation. The doping of the P-type impurity by this boron radiation, is performed with respect to the whole region in which the image pickup element is formed on the substrate 11.

After the above process, a silicon oxide film 18, a silicon nitride film 19, a gate electrode 20, and a silicon oxide layer 21 covering the gate electrode 20, are formed thereon. Also, a second gate electrode (unshown) is formed thereon. Then, the light receiving part 13 is formed by doping the N-type impurity to a rectangular region which is defined by the gate electrode 20 and the second gate electrode. In the same way, the surface $P^+$ layer 16 is formed by making use of the self-alignment of the gate electrode. Incidentally, the surface $P^+$ layer 16 is connected to the $P^+$ impurity layer 16a which has already been formed. The surface $P^+$ layer 16 is grounded outside a region in which a large number of the image pickup elements are arranged, and the electrical potential of the surface of the light receiving part 13 is made equal to a GND electrical potential. Then, the image pickup element 200 is accomplished by forming the light blocking metal layer 22 with a dry etching.

When an image is read by the solid-state image sensing device (so-called a CCD tip) which is composed of a large number of the image pickup elements 200 formed on a single piece of substrate, and when the image thus having been read out is shown on a display device, a blank pixel appears on a reproduction image of the display device in correspondence to a location at which the image pickup element with malfunction exists. The blank pixel is not desirable. In order to form the light receiving part 13 of the aforementioned conventional image pickup element 200, the N-type impurity is doped therein. Hereat, the amount of the N-type impurity, performing an actual photoelectric conversion, is decreased due to the effect of the P-type impurity layer 17 having already been doped, and this has been one factor causing the malfunction.

In order to solve the aforementioned technical problem, there has been proposed a formation of the impurity layer 17 for controlling the threshold value, in correspondence to a location only at which the impurity layer 17 functions as the electric charge readout part 23 under the gate electrode 20, during manufacturing of the image pickup element 200 (refer to Japanese Unexamined Laid-Open Patent Publication No. 1-281764).

However, when the impurity layer 17 is formed only at the location at which the layer 17 functions as the electric charge readout part 23 under the gate electrode 20, it is necessary to prepare a resist mask at the location where the impurity is doped, and therefore it is necessary to set the gate electrode larger (or longer) to some extent. Under the situation that the miniaturization of the image pickup element is desired, making the gate electrode larger (or longer) by taking any deviation etc., relating to accuracy in manufacturing, of the mask into consideration, is not desirable because of incurring the decrease of the capacity of the light receiving part 13.

SUMMARY OF THE INVENTION

Therefore, it is an object of the present invention to provide a small-sized image pickup element that has a light receiving part in which a necessary capacity is secured and that operates accurately.

It is another object of the present invention to provide a method for manufacturing the small-sized image pickup element.

In accomplishing the above object of the present invention, according to one aspect thereof, there is provided a first image pickup element having a semiconductor substrate of a conductivity type which includes at least a light receiving part, an electric charge readout part, and an electric charge transfer part. The light receiving part transforms a light incident on a light receiving surface into an electric charge. The electric charge readout part reads out the electric charge which is generated by the light receiving part. The electric charge transfer part outputs the electric charge which is read out by the electric charge readout part. The first image pickup element comprises a non-doping region and a layer made of the first impurity. The non-doping region is provided away from a boundary line on a side of the electric charge readout part, within the light receiving surface of the light receiving part. The first impurity for identifying threshold value of the electric charge readout part is not doped into the non-doping region. The layer made of the first impurity is provided at least in a doping region, except the non-doping region, within the light receiving surface of the light receiving part, in the electric charge transfer part, and in the electric charge readout part.

In accomplishing the above object of the present invention, according to another aspect thereof, there is provided a second image pickup element, wherein the layer made of the first impurity is provided in a doping region, except the non-doping region, within the light receiving surface of the light receiving part, and in a region outside the light receiving part except the light receiving part.

In accomplishing the above object of the present invention, according to still another aspect thereof, there is provided a third image pickup element, wherein the light receiving part is formed by doping only a necessary amount of a second impurity of a conductivity type, different from the first impurity, for making the non-doping region function as the light receiving part, with respect to the non-doping region into which the first impurity is not doped and with respect to the doping region of the first impurity, in one of the above first and second image pickup elements.

In accomplishing the above another object of the present invention, there is provided a first method for manufacturing an image pickup element having a semiconductor substrate of a conductivity type which includes at least a light receiving part, an electric charge readout part, and an electric charge transfer part. The light receiving part transforms a light incident on a light receiving surface into an electric charge. The electric charge readout part reads out the electric charge which is generated by the light receiving part. The electric charge transfer part outputs the electric charge which is read out by the electric charge readout part. The first method for manufacturing the image pickup element of the present invention comprises a step of forming a layer made of a first impurity for identifying threshold value of the electric charge readout part, at least in a doping region, except the non-doping region, within the light receiving surface of the light receiving part, and in the electric charge readout part. The non-doping region is provided away from a boundary line on a side of the electric charge readout part, within the light receiving surface of the light receiving part, and prohibits doping of the first impurity.

In accomplishing the above another object of the present invention, there is provided a second method for manufacturing the image pickup element, wherein, in the step of forming the layer made of the first impurity, the layer made of the first impurity is formed in a doping region, except the non-doping region, within the light receiving surface of the light receiving part, and in a region outside the light receiving part except the light receiving part.

In accomplishing the above another object of the present invention, there is provided a third method for manufacturing the image pickup element, wherein, in one of the above first and second methods, there is further provided a step of doping only a necessary amount of a second impurity of a conductivity type, different from the first impurity, for making the non-doping region function as the light receiving part, with respect to the non-doping region into which the first impurity is not doped and with respect to the doping region of the first impurity, as a step of forming the light receiving part.

BRIEF DESCRIPTION OF THE DRAWINGS

These and other objects and features of the present invention will become clear from the following description taken in conjunction with the preferred embodiment thereof with reference to the accompanying drawings.

DETAILED DESCRIPTION

Figure 4:
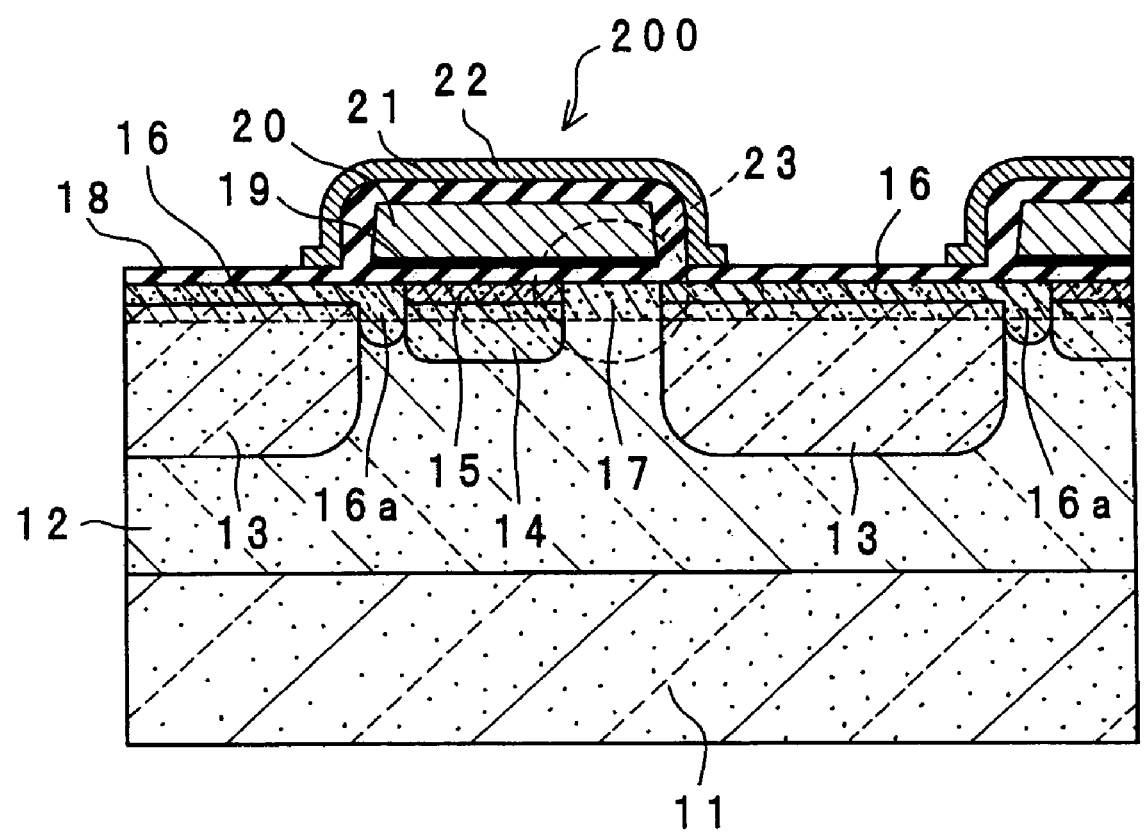
FIG. 4 is a cross-sectional view showing a structure of an image pickup element according to prior art.

Concerning the pixel defect shown as a white spot on a reproduction image of a display device caused by a malfunction of an image pickup element, in a case that an image is read by a solid-state image sensing device which is composed of a lot of image pickup elements formed on a single piece of substrate and that the image thus having been read is shown on the display device, the inventor of the present application investigated the cause of such a pixel defect. As a result of the investigation, the inventor found that the occurrence rate of the pixel defect increases as the amount of impurity in the light receiving part exceeds a necessary amount. Namely, the inventor finds that when a certain capacity of the light receiving part 13 is tried to be secured by increasing the doping amount of the N-type impurity in the aforementioned image pickup element 200 (refer to FIG. 4), the quality of the image pickup element 200 is deteriorated to the contrary.

Meanwhile, as also explained above, in a case that a small amount of the impurity is doped to a location only at which it functions as the electric charge readout part 23 under the gate electrode 20 (as shown in Japanese Unexamined Laid-Open Patent Publication No. 1-281764), it leads to growing in size of the gate electrode, and/or to unevenness of quality, as a product, of the CCD layer 15 and the light receiving part 13, on the basis of variation in capacity by the dispersion of the N-type impurity.

The image pickup element according to the present invention, has a non-doping region "A" (refer to FIG. 1) for preventing a doping of P-type impurity for controlling the threshold value of the electric charge readout part, at a location away from a boundary line on a side of the electric charge readout part, within a light receiving surface of the light receiving part. In the structure, the P-type impurity is doped into the whole remaining region. The terminology of the "whole remaining region" means a region which forms the image pickup element, which corresponds to "a doping region" except the non-doping region "A" in the light receiving part, and which corresponds to "a region outside the light receiving part" except the light receiving part. By the way, it is explained below about the non-doping region "A", the doping region, and the region outside the light receiving part, with reference to FIG. 3, in detail. Adopting the structure, upon forming the light receiving part, it is possible to dope only a necessary amount of the N-type impurity for making the light receiving part operate accurately with respect to the non-doping region "A". Therefore, it is possible to prevent the gate electrode from growing in size, to form the light receiving part 13 having a necessary capacity, and to prevent doping of an unnecessarily excess amount of impurity which may cause deterioration of the quality.

With reference to FIGS. 1, 2A–2E, 3A and 3B, a description is made below upon an image pickup element 100 according to an embodiment of the present invention. Incidentally, components corresponding to those of the aforementioned image pickup element 200, are designated by the same reference numerals.

Figure 1:
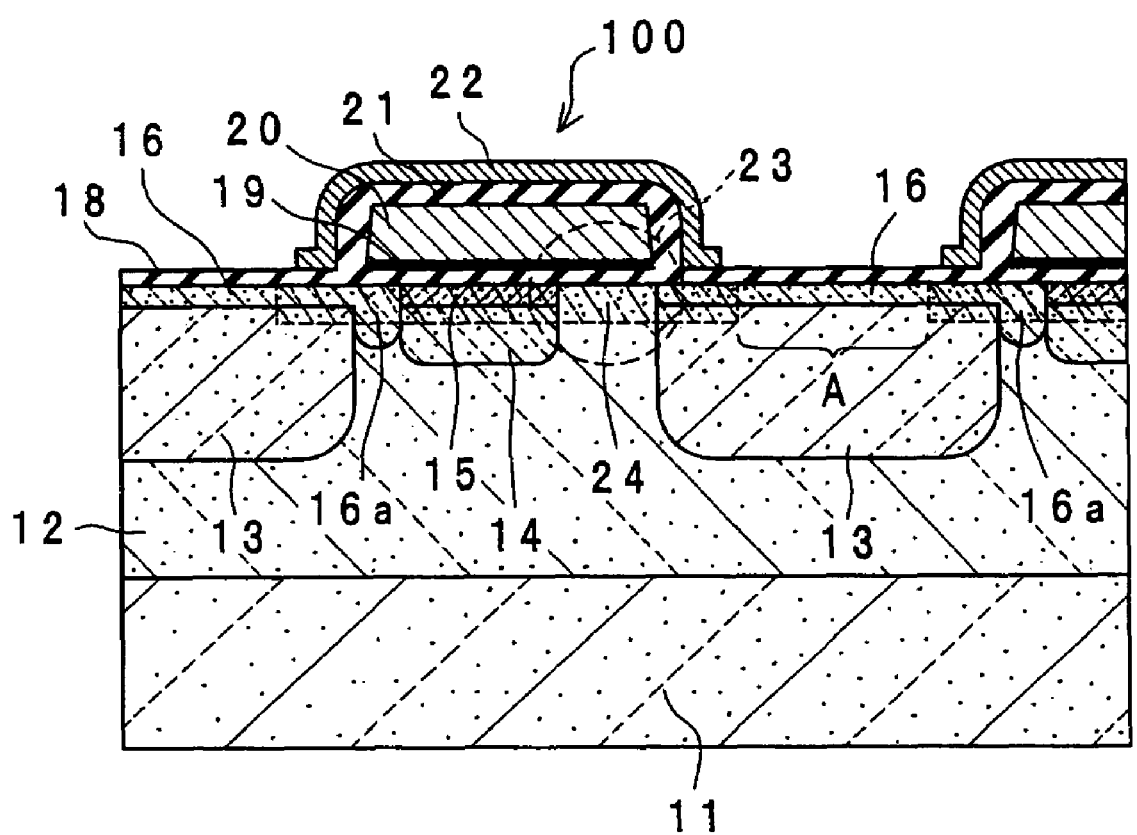
FIG. 1 is a cross-sectional view showing a structure of an image pickup element according to an embodiment of the present invention.

FIG. 1 is a figure showing a structure of the image pickup element 100. A light receiving part 13 is a N-type impurity layer which transforms a light incident on a light receiving surface into an amount of electric charge in accordance with the intensity of the light. A P-type well layer 12 discharges an excess amount of electric charge generated in the light receiving part 13 when an excess amount of light is incident on the light receiving surface, to an N-type semiconductor substrate 11. Namely, the P-type well layer 12 functions as a vertical type overflow drain. The electric charge readout part (which is also referred to as transfer gate part) 23 reads out the electric charge generated in the light receiving part 13. A CCD layer (which is also referred to as electric charge transfer part or as CCD register) 15 outputs the electric charge, of the light receiving part 13, which is readout by the electric charge readout part 23 to an output circuit (unshown). The barrier layer 14 under the CCD layer 15 prevents an exchange of electric charge between the CCD layer 15 and the N-type semiconductor substrate 11. A surface $P^+$ layer 16 includes a $P^+$ impurity layer 16a for separating between the adjacent image pickup elements, and the surface $P^+$ layer 16 controls the dark current of the light receiving part 13. Depending upon the amount of the P-type impurity doped in a P-type impurity layer 24, the threshold value of the electric charge readout part 23 is controlled.

As shown in the figure, the image pickup element 100 has a feature that there is provided a non-doping region "A" into which the P-type impurity is not doped, at a location away from a boundary line on a side of the electric charge readout part 23, within a light receiving surface of the light receiving part 13; namely, that there is provided the non-doping region "A" generally centrally of the light receiving surface of the light receiving part 13. Upon formation of the light receiving part 13, the provision of the non-doping region "A" enables a necessary amount of impurity to be doped therein by which the non-doping region "A" functions as the light receiving part accurately. Owing to the provision thereof, it is possible to form the light receiving part 13 having a necessary capacity without letting the gate electrode 20 grow in size, and it is also possible to prevent doping of any excessive amount of impurity which may incur deterioration of the quality.

Also, according to the embodiment, there is no need of doping a small amount of P-type impurity to only a part serving as the electric charge readout part 23 under the gate electrode 20. Consequently, it is not necessary to prepare a minute and delicate resist in its making process, thus facilitating the manufacture.

Also, according to the embodiment, there is no need of designing the gate electrode so as to cover the small amount of the P-type impurity having been doped. Therefore, it is possible to miniaturize the gate electrode.

Figure 2A:
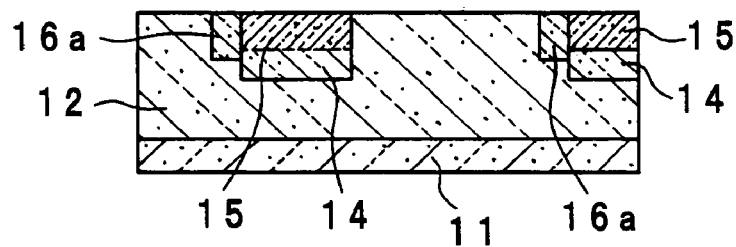
FIGS. 2A–2E are views showing steps for manufacturing the image pickup element of FIG. 1.

FIGS. 2A to 2E are figures showing a series of steps for manufacturing the image pickup element 100 having the aforementioned structure. Firstly, as shown in FIG. 2A, the P-type well layer 12, the barrier layer 14 made of P-type impurity under a CCD layer 15, the CCD layer 15 made of N-type impurity, and the $P^+$ impurity layer 16a for separating between the adjacent image pickup elements, are formed consecutively on the N-type semiconductor substrate 11 of a conductivity type, by sequentially and repeatedly executing a patterning, an ion doping, a resist peeling, and a thermal treatment.

Figure 2B:
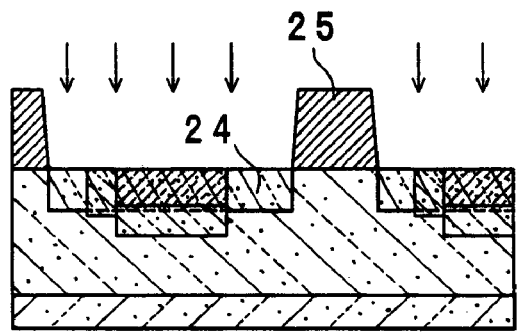

Next, as shown in FIG. 2B, the P-type impurity layer 24 is formed by doping the P-type impurity with an ion injection. Hereat, in order to delimit a non-doping region "A" away from a boundary line on a side of the electric charge readout part 23 within a light receiving surface of the light receiving part 13, a region, corresponding to the non-doping region "A", of the P-type well layer 12, is masked by a resist 25.

By the way, the size of the resist 25 and the location at which the resist 25 is mounted, are set such that the non-doping region "A" does not locate outside the light receiving part 13 and does not overlap a region of the electric charge readout part 23, the overlap possibly being caused by a deviation etc. of the mask during its manufacturing process. As explained below, the light receiving part 13 is formed on the basis of self-alignment employing a gate electrode. Therefore, the size of the resist 25 and the location at which the resist 25 is mounted, are set in consideration of the variation in size and misalignment of the mounting position of the resist 25 caused by the degree of accuracy (or precision) in the manufacture of the resist 25 itself, and/or in consideration of the variation in size and misalignment of the mounting position of the mask for the gate electrode caused by the degree of accuracy (or precision) in the manufacture of the mask, and/or the like. By adopting the resist 25 which is set in this way in consideration of these factors, the non-doping region "A" is prevented from locating outside the light receiving part 13 and from overlapping the electric charge readout part 23. Consequently, for example, deterioration of readout characteristic thereof caused by a formation of a low density region of the impurity in the P-type well layer 12, inadequate separation between the adjacent image pickup elements, variation in capacity of the light receiving part 13, or the like, can be prevented.

By the way, the location of formation of the non-doping region "A" is the location where the non-doping region "A" is secured to be away from the boundary line on the side of the electric charge readout part 23 within the light receiving surface of the light receiving part 13. Provided that this condition is satisfied and that the non-doping region "A" is within an extent (or degree) of not affecting the function of the adjacent image pickup element, the non-doping region "A" can be provided beyond a planned region in which the light receiving part 13 is to be formed. For example, if the non-doping region "A" is desired to expand rightward in the figure, it is possible to form the region so as to overlap part of the $P^+$ impurity layer 16a. However, in this case, the non-doping region "A" must not overlap the CCD layer 15. This is because the overlap thereof reduces an area of the region of the electric charge readout part of the adjacent image pickup element (i.e. the right image pickup element separated by the $P^+$ impurity layer 16a in the figure).

Figure 3A:
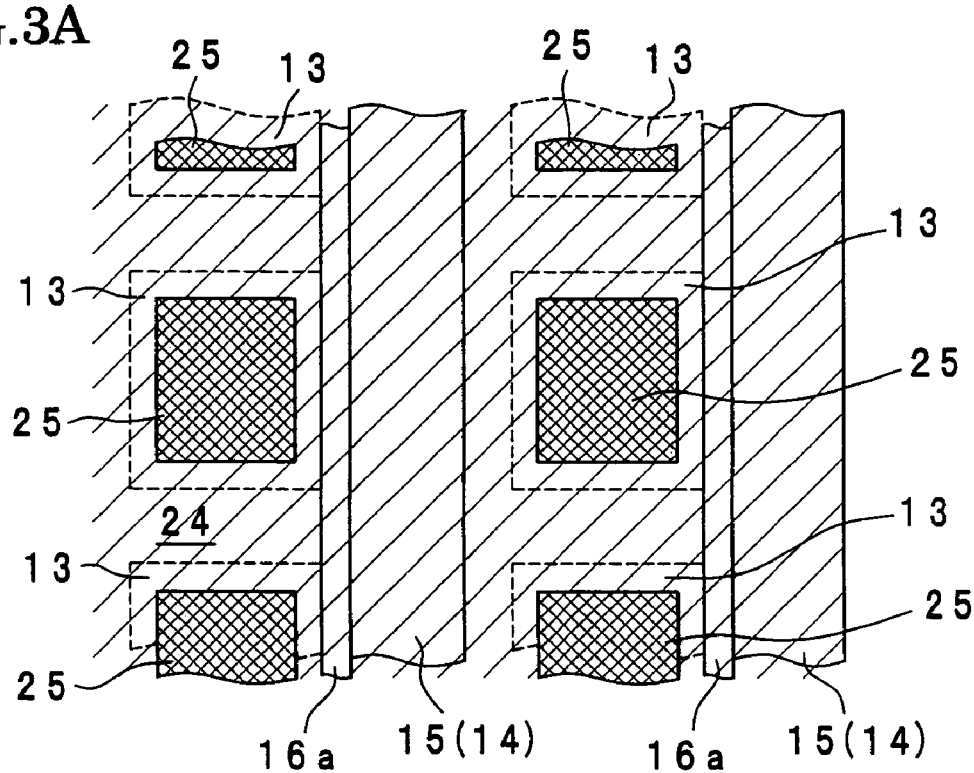
FIG. 3A is a top view of the image pickup element of FIG. 1 at time of its manufacture.

FIG. 3A is a top view showing the image pickup element 100 of FIG. 2B. In the figure, the region masked by the resist 25 to secure the non-doping region "A", is shown by a cross hatching. Any corresponding member or part is designated by the same reference numeral as used in other figures. Also, a planned region in which the light receiving part 13 is to be formed, is shown by a dotted line in a rectangular form. The region in which the P-type impurity is doped, is shown by a hatching.

Incidentally, a region outside the region shown by the cross hatching (i.e. region corresponding to the non-doping region "A"), in the region (i.e. the planned region in which the light receiving part 13 is to be formed) enclosed by the dotted line, is referred to as the "doping region" in the above. Meanwhile, a region outside the light receiving part 13, in the region shown by the hatching, is referred to as the "region outside light receiving part" in the above.

Figure 2C:
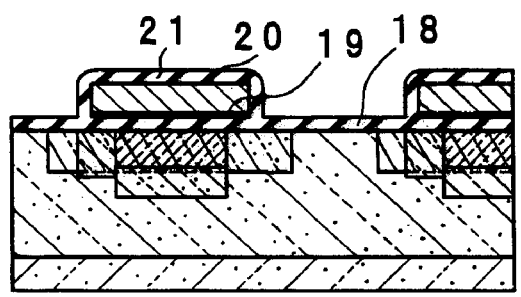
Figure 2D:
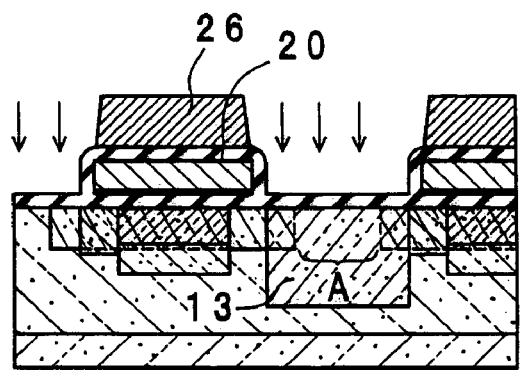
Figure 2E:
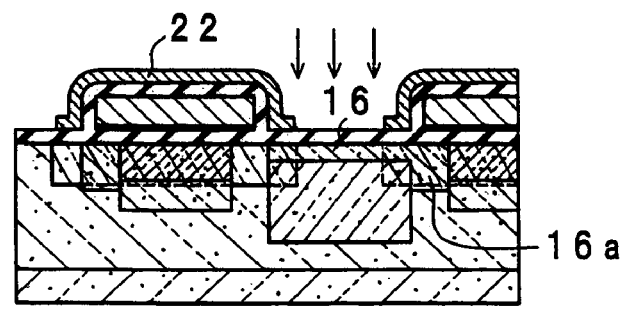
Figure 3B:
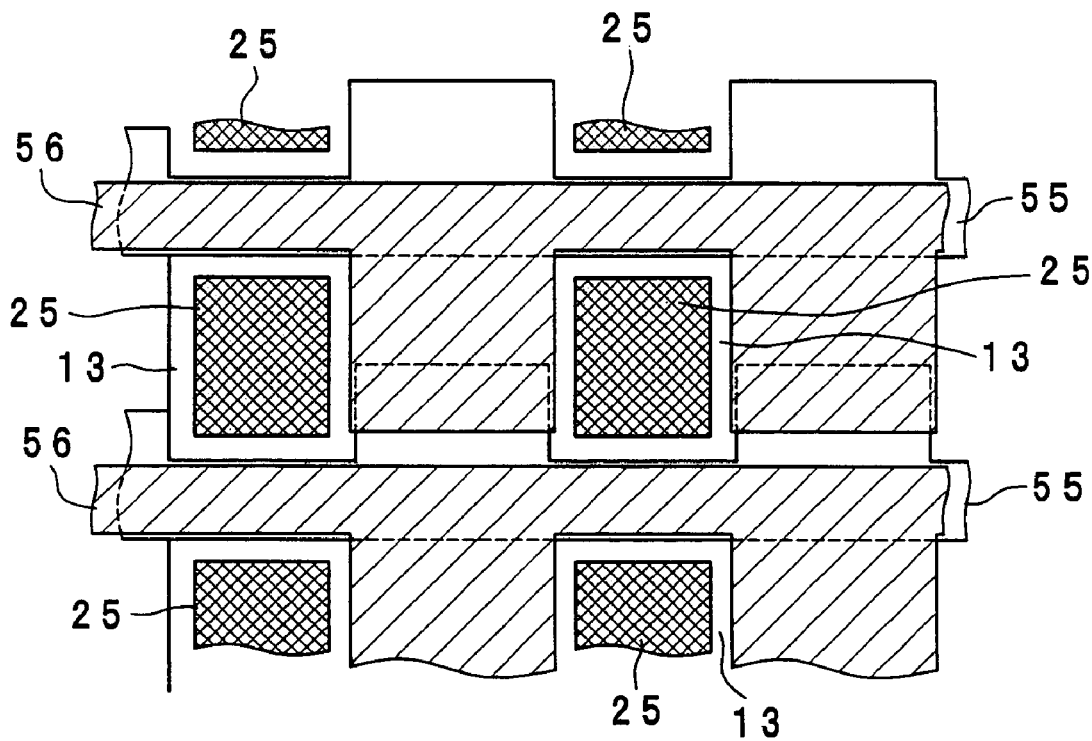
FIG. 3B is a top view of the image pickup element of FIG. 1, showing a light receiving part region which is sectioned by a first gate electrode and a second gate electrode.

In FIG. 3B, a first gate electrode pattern 55 sectioning the light receiving part 13, is designated by a blank outline; and a second gate electrode pattern 56 is designated by a hatching. Also, the resist 25 for securing the non-doping region "A", is designated by a cross hatching, in the figure. The first gate electrode pattern 55 shows a mask pattern for the gate electrode (first gate electrode) 20. The second gate electrode pattern 56 shows a mask pattern for the second gate electrode which is not shown in FIGS. 2A–2E. The second gate electrode is an electrode which is employed for reading out the electric charge from the light receiving part 13 to the CCD layer 15, and for outputting the electric charge of the CCD layer 15 to an output circuit (unshown).

Next, back to FIG. 2C, a gate insulation film (or silicon oxide film) 18 and a silicon nitride film 19 are formed with respect to the P-type well layer 12, and further a polycrystalline silicon film, having a low resistance realized by a thermodiffusion of phosphorus or ion injection, is formed therewith. And the gate electrode 20 is formed thereon by a patterning and a dry etching, and then a silicon oxide film 21 is formed on the gate electrode 20 by a thermal oxidation. In the same manner, the second gate electrode (unshown) is formed.

Next, as shown in FIG. 2D, the N-type impurity is doped to all the region of the light receiving surface which is sectioned by the gate electrode 20 and the second gate electrode and which includes the non-doping region "A", thereby forming the light receiving part 13. Upon the doping of the impurity thereinto, the resist 26 which is smaller than the gate electrode 20, is used, and the self-alignment by the gate electrode 20 is utilized. By the way, a necessary amount of the N-type impurity for making the non-doping region "A" function as the light receiving part 13 accurately, preferably a minimum amount of the N-type impurity for achieving the same, is doped, without considering the counteraction by the P-type impurity having already been doped therein. Thereby, such a doping of an excess amount of impurity into the light receiving part 13 that may cause malfunction thereof, can be prevented.

Further, as shown in FIG. 2E, the surface $P^+$ layer 16 is formed by performing a patterning, an ion injection, a resist peeling off and a thermal treatment, due to the self-alignment by the gate electrode 20. In order that the surface of the light receiving part may be grounded to the GND electric charge, the surface $P^+$ layer 16 is connected to the $P^+$ impurity layer 16a to be grounded to the GND electric charge outside the pixel area. Thereafter, a light blocking layer 22 is formed by forming a metal layer, having a high melting point, made of tungsten etc., and performing the patterning and the dry etching.

By taking the aforementioned above steps, the image pickup element 100 is manufactured.

The first image pickup element according to the present invention, has the first impurity layer for controlling the threshold value in the electric charge readout part, in the doping region except the non-doping region in the light receiving part, in the electric charge transfer part, and in the electric charge readout part. In other words, there exists the first impurity from the light receiving part to the electric charge readout part. Therefore, with the structure, malfunction of the image pickup element is effectively prevented.

Also, the light receiving part of the first image pickup element has the non-doping region into which the first impurity is not doped. Therefore, the light receiving part is not affected by the first impurity, thus realizing a stable performance.

The second image pickup element according to the present invention, has the first impurity layer for controlling the threshold value in the electric charge readout part, in the doping region except the non-doping region and in the region outside the light receiving part except the light receiving part. That is, there exists the first impurity from the light receiving part to the electric charge readout part, and therefore malfunction of the image pickup element is prevented.

Also, the light receiving part of the second image pickup element has the non-doping region into which the first impurity is not doped. Therefore, the light receiving part is not affected by the first impurity, thus achieving a stable performance.

The light receiving part of the third image pickup element according to the present invention, is made of a necessary amount of the second impurity for making the non-doping region function as the light receiving part normally. Therefore, with the structure, the occurrence of malfunction of the image pickup element is diminished effectively.

According to the first method for manufacturing the image pickup element of the present invention, the first impurity layer is formed, at least, in the doping region except the non-doping region within the light receiving part and in the electric charge readout part. Therefore, in comparison with a structure in which the first impurity layer is formed only in the electric charge readout part, the manufacture thereof is facilitated because there is no need of any minute or delicate mask.

According to the second method for manufacturing the image pickup element of the present invention, the first impurity layer is formed in the doping region except the non-doping region and in the region outside the light receiving part except the light receiving part. Therefore, in comparison with a structure in which the first impurity layer is formed only in the electric charge readout part, the manufacture thereof is facilitated because there is no need of any minute or delicate resist.

According to the third method for manufacturing the image pickup element of the present invention, the second impurity is doped with respect to the non-doping region by amount only necessary for making the non-doping region function as the light receiving part normally. Therefore, with the method, it is possible to manufacture the image pickup element with a stable and accurate performance.

Although the present invention has been fully described in connection with the preferred embodiment thereof with reference to the accompanying drawings, it is to be noted that various other changes and modifications are also apparent to those skilled in the art. Such changes and modifications are to be understood as included within the scope of the present invention as defined by the appended claims unless they depart therefrom.

The invention claimed is:

1. An image pickup element having a semiconductor substrate of a conductivity type which includes at least:
    a light receiving part for transforming a light incident on a light receiving surface into an electric charge;
    an electric charge readout part for reading out the electric charge which is generated by the light receiving part; and
    an electric charge transfer part for outputting the electric charge which is read out by the electric charge readout part,
    the image pickup element comprising:
    a non-doping region which is provided away from a boundary line on a side of the electric charge readout part, within the light receiving surface of the light receiving part, and which a first impurity for identifying threshold value of the electric charge readout part is not doped into; and
    a layer made of the first impurity, the layer being provided at least in a doping region, except the non-doping region, within the light receiving surface of the light receiving part, in the electric charge transfer part, and in the electric charge readout part.

2. The image pickup element as claimed in claim 1, wherein the layer made of the first impurity is provided in a doping region, except the non-doping region, within the light receiving surface of the light receiving part, and in a region outside the light receiving part except the light receiving part.

3. The image pickup element as claimed in claim 1, wherein the light receiving part is formed by doping only a necessary amount of a second impurity of a conductivity type, different from the first impurity, for making the non-doping region function as the light receiving part, with respect to the non-doping region into which the first impurity is not doped and with respect to the doping region of the first impurity.

4. The image pickup element as claimed in claim 2, wherein the light receiving part is formed by doping only a necessary amount of a second impurity of a conductivity type, different from the first impurity, for making the non-doping region function as the light receiving part, with respect to the non-doping region into which the first impurity is not doped and with respect to the doping region of the first impurity.

* * * * *